(12) United States Patent
Li

(10) Patent No.: US 12,274,084 B2
(45) Date of Patent: *Apr. 8, 2025

(54) NORMALLY-CLOSED DEVICE AND FABRICATION METHOD THEREOF

(71) Applicant: GUANGDONG ZHINENG TECHNOLOGY CO., LTD., Guangdong (CN)

(72) Inventor: Zilan Li, Guangdong (CN)

(73) Assignee: GUANGDONG ZHINENG TECHNOLOGY CO., LTD., Guangdong (CN)

( * ) Notice: Subject to any disclaimer, the term of this patent is extended or adjusted under 35 U.S.C. 154(b) by 615 days.

This patent is subject to a terminal disclaimer.

(21) Appl. No.: 17/595,001

(22) PCT Filed: Jan. 28, 2021

(86) PCT No.: PCT/CN2021/074156
§ 371 (c)(1),
(2) Date: Nov. 5, 2021

(87) PCT Pub. No.: WO2021/258732
PCT Pub. Date: Dec. 30, 2021

(65) Prior Publication Data
US 2022/0285538 A1 Sep. 8, 2022

(30) Foreign Application Priority Data
Jun. 24, 2020 (CN) .......................... 202010590696.3

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/124* (2025.01); *H10D 62/824* (2025.01); *H10D 62/8503* (2025.01)

(58) Field of Classification Search
None
See application file for complete search history.

(56) References Cited

U.S. PATENT DOCUMENTS 9,099,491 B2 * 8/2015 Charles ............... H10D 30/015
2012/0267637 A1 10/2012 Jeon et al.
(Continued)

FOREIGN PATENT DOCUMENTS

CN 103367422 A 10/2013
CN 109037323 A 12/2018
(Continued)

OTHER PUBLICATIONS

Supplementary European Search Report mailed Jun. 3, 2022, in connection with European Patent Application No. 21791243.5, 3 pgs.

(Continued)

*Primary Examiner* — Nishath Yasmeen
(74) *Attorney, Agent, or Firm* — Chiesa Shahinian & Giantomasi PC

(57) ABSTRACT

A normally-closed device and a fabrication method thereof, relating to the technical field of semiconductors, is disclosed. The normally-closed device comprises a substrate, an epitaxial layer connected to the substrate comprising a first P-type nitride layer and a modified layer located on two sides of the first P-type nitride layer and formed by modifying a second P-type nitride layer in a preset region, where the first P-type nitride layer and the second P-type nitride layer are formed by epitaxially growing synchronously, a barrier layer connected to the first P-type nitride layer and (Continued)

the modified layer, a gate electrode connected to the barrier layer, and a source electrode and a drain electrode connected to the modified layer.

11 Claims, 4 Drawing Sheets

(51) Int. Cl.
    *H10D 62/10*       (2025.01)
    *H10D 62/824*    (2025.01)
    *H10D 62/85*       (2025.01)

(56) References Cited

U.S. PATENT DOCUMENTS

| | | | | |
|---|---|---|---|---|
| 2013/0256685 A1* | 10/2013 | Ohki | ............... | H01L 21/02365 |
| | | | | 257/194 |
| 2020/0013862 A1* | 1/2020 | Srivastava | ........... | H01L 29/1087 |
| 2022/0093779 A1* | 3/2022 | Fiorenza | ............. | H01L 29/1083 |
| 2022/0254911 A1* | 8/2022 | Li | ..................... | H01L 29/1087 |

FOREIGN PATENT DOCUMENTS

| | | |
|---|---|---|
| CN | 210467852 U | 5/2020 |
| CN | 212062440 U | 12/2020 |
| WO | WO2020/055984 A1 * | 9/2019 |

OTHER PUBLICATIONS

Communication pursuant to Article 94(3) EPC mailed Jun. 17, 2022, in connection with European Patent Application No. 21791243. 5, 7 pgs.

Translation of International Search Report mailed May 6, 2021, in connection with International Patent Application No. PCT/CN2021/074156, filed Jan. 28, 2021, 2 pgs.

First Office Action mailed Jul. 12, 2024 in connection with Japanese Patent Application No. 202011527315.3, 57 pgs. (including translation).

International Search Report and Written Opinion mailed May 6, 2021, in connection with International Patent Application No. PCT/CN2021/074156, filed Jan. 28, 2021, 10 pgs (english Translation thereof to be submitted once published by WIPO).

* cited by examiner

NORMALLY-CLOSED DEVICE AND FABRICATION METHOD THEREOF

CROSS-REFERENCE TO RELATED APPLICATION

This application is a National Stage under 35 U.S.C. 371 of International Patent Application No. PCT/CN2021/074156, filed Jan. 28, 2021, which claims priority to Chinese Patent Application No. 2020105906963, filed on Jun. 24, 2020 the disclosure of both is incorporated herein by reference in its entirety.

TECHNICAL FIELD

The present disclosure relates to the technical field of semiconductors, in particular, to a normally-closed device and a fabrication method thereof.

BACKGROUND ART

Currently, the process of fabricating a normally-closed device is generally realized by fabricating a P-type nitride semiconductor gate electrode on a barrier layer. Due to the poor insulation performance of the barrier layer, the occurrence of a large gate current is easily caused. Meanwhile, due to the separation of the barrier layer, the gate electrode is also relatively far from a channel, which is not favorable for obtaining a relatively high threshold voltage.

In summary, there is a problem in the prior art that the normally-closed device has relatively low threshold voltage and relatively large gate current and drain current.

SUMMARY

The present disclosure provides a normally-closed device and a fabrication method thereof, so as to solve the problems in the prior art that the normally-closed device has relatively low threshold voltage and relatively large gate current and drain current.

Technical solutions adopted in embodiments of the present disclosure are as follows.

Embodiments of the present disclosure provide a normally-closed device, wherein the normally-closed device includes:
  a substrate;
  an epitaxial layer connected to the substrate, wherein the epitaxial layer comprises a first P-type nitride layer and a modified layer, the modified layer is located on two sides of the first P-type nitride layer, the modified layer is formed by modifying a second P-type nitride layer in a preset region, and the first P-type nitride layer and the second P-type nitride layer are formed by epitaxially growing synchronously;
  a barrier layer connected to the first P-type nitride layer and the modified layer; and
  a gate electrode connected to the barrier layer, and a source electrode and a drain electrode connected to the modified layer.

Optionally, height of the modified layer located in a source electrode region and a region between the source electrode and the drain electrode is less than that of the first P-type nitride layer, and the modified layer located in the source electrode region and a region between the source electrode and the drain electrode is formed by partially modifying the second P-type nitride layer, so that the modified layer is connected to the second P-type nitride layer and the barrier layer, respectively; and the normally-closed device further comprises a body electrode connected to the second P-type nitride layer and the source electrode, respectively.

Optionally, a doping concentration of the second P-type nitride layer is variable in an epitaxial growth direction.

Optionally, the doping concentration of the second P-type nitride layer is decreased in the epitaxial growth direction.

Optionally, the doping concentration of the second P-type nitride layer is decreased first and then increased in the epitaxial growth direction.

Optionally, the normally-closed device comprises a buffer layer, and the buffer layer is grown along a growth surface of the substrate.

Optionally, the normally-closed device comprises a mounting region, the mounting region penetrates through the barrier layer and the modified layer located in the source electrode region, and the body electrode is provided in the mounting region.

Optionally, the normally-closed device further comprises a passivation layer, and the passivation layer is formed on the barrier layer.

Optionally, the normally-closed device further comprises an insulating layer located between the gate electrode and the barrier layer.

Optionally, the normally-closed device further comprises a channel layer, one side of the channel layer is connected to the first P-type nitride layer and the modified layer respectively, and the other side of the channel layer is connected to the barrier layer, the source electrode, and the drain electrode.

Embodiments of the present disclosure further provide a fabrication method of a normally-closed device, wherein the method comprises:
  providing a substrate;
  fabricating an epitaxial layer in a growth surface of the substrate, wherein the epitaxial layer comprises a first P-type nitride layer and a second P-type nitride layer, the second P-type nitride layer is located on two sides of the first P-type nitride layer, and the first P-type nitride layer and the second P-type nitride layer are formed by epitaxially growing synchronously;
  modifying the second P-type nitride layer so as to form a modified layer on two sides of the first P-type nitride layer;
  fabricating a barrier layer along a side of the first P-type nitride layer and a side of the modified layer, with the two sides away from the substrate; and fabricating a gate electrode, a source electrode, and a drain electrode.

Optionally, the step of modifying the second P-type nitride layer so as to form a modified layer on two sides of the first P-type nitride layer comprises:
  fabricating a mask along a surface of the first P-type nitride layer;
  modifying the second P-type nitride layer in a manner of ion implantation, until the second P-type nitride layer is completely modified; and removing the mask.

Optionally, the step of modifying the second P-type nitride layer in a manner of ion implantation comprises:
  implanting Si, Ge, N or Ar into the second P-type nitride layer in a manner of ion implantation.

Optionally, the step of modifying the second P-type nitride layer so as to form a modified layer on two sides of the first P-type nitride layer comprises:
  fabricating a mask along a surface of the first P-type nitride layer;

partially modifying the second P-type nitride layer in a manner of ion implantation;

modifying the second P-type nitride layer located in a drain electrode region in a manner of ion implantation, until the second P-type nitride layer located in the drain electrode region is completely modified; and removing the mask; and after the step of fabricating a gate electrode, a source electrode, and a drain electrode, the method further comprises:

fabricating a body electrode, wherein the body electrode is connected to the second P-type nitride layer and the source electrode, respectively.

Optionally, the step of partially modifying the second P-type nitride layer in a manner of ion implantation comprises:

implanting the ions into the second P-type nitride layer according to a first energy and dose; and the step of modifying the second P-type nitride layer located in a drain electrode region in a manner of ion implantation until the second P-type nitride layer located in the drain electrode region is completely modified comprises:

implanting the ions into the second P-type nitride layer according to a second energy and dose; wherein the first energy and dose are less than the second energy and dose.

Compared with the prior art, beneficial effects of the present disclosure, for example, include the follows.

The embodiments of the present disclosure provide a normally-closed device and a fabrication method thereof. The normally-closed device comprises a substrate; an epitaxial layer connected to the substrate, wherein the epitaxial layer comprises a first P-type nitride layer and a modified layer, the modified layer is located on two sides of the first P-type nitride layer, the modified layer is formed by modifying a second P-type nitride layer in a preset region, and the first P-type nitride layer and the second P-type nitride layer are formed by epitaxially growing synchronously; a barrier layer connected to the first P-type nitride layer and the modified layer; and a gate electrode connected to the barrier layer, and a source electrode and a drain electrode connected to the modified layer. As it is easier to realize the manner of performing modification in some regions, it can be more conveniently realized that an effective P-type and desired device structure only exist in some regions.

BRIEF DESCRIPTION OF DRAWINGS

In order to more clearly illustrate technical solutions of embodiments of the present disclosure, accompanying drawings which need to be used in the embodiments will be introduced briefly below, and it should be understood that the accompanying drawings below merely show some embodiments of the present disclosure, therefore, they should not be considered as limitation on the scope, and those ordinarily skilled in the art still could obtain other relevant drawings according to these accompanying drawings, without using any creative efforts.

Figure 1:
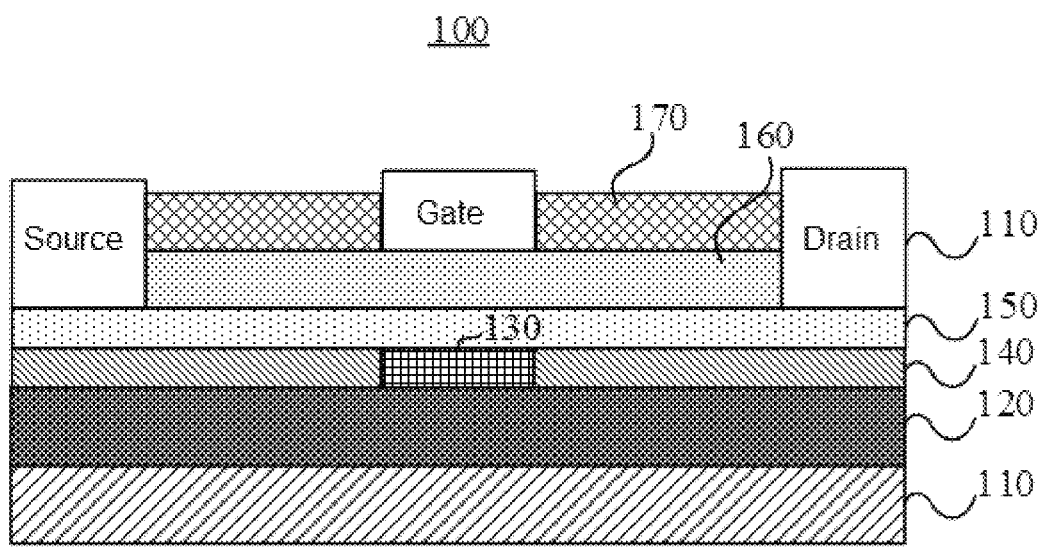
FIG. 1 is a sectional diagram of a normally-closed device provided in an embodiment of the present disclosure.

In the drawings: 100—normally-closed device; 110—substrate; 120—buffer layer; 130—first P-type nitride layer; 140—modified layer; 150—channel layer; 160—barrier layer; 170—passivation layer; 180—body electrode.

DETAILED DESCRIPTION OF EMBODIMENTS

In order to make objectives, technical solutions, and advantages of the embodiments of the present disclosure clearer, the technical solutions in the embodiments of the present disclosure will be described clearly and completely below in conjunction with accompanying drawings in the embodiments of the present disclosure, and apparently, the embodiments described are some but not all embodiments of the present disclosure. Generally, components in the embodiments of the present disclosure, as described and shown in the accompanying drawings herein, may be arranged and designed in various different configurations.

Therefore, the detailed description below of the embodiments of the present disclosure provided in the accompanying drawings is not intended to limit the scope of the present disclosure claimed, but merely illustrates chosen embodiments of the present disclosure. All of other embodiments obtained by those ordinarily skilled in the art based on the embodiments in the present disclosure without using creative efforts shall fall within the scope of protection of the present disclosure.

It should be noted that similar reference signs and letters represent similar items in the following accompanying drawings, therefore, once a certain item is defined in one accompanying drawing, it is not needed to be further defined or explained in subsequent accompanying drawings. Meanwhile, in the description of the present disclosure, terms such as "first" and "second" are merely for distinctive description, but should not be construed as indicating or implying importance in relativity.

It should be indicated that in the present text, relational terms such as first and second are merely for distinguishing one entity or operation from another entity or operation, while it is not necessarily required or implied that these entities or operations have any such practical relation or order. Moreover, terms "including", "containing" or any other variations thereof are intended to be non-exclusive, thus a process, method, article or device including a series of elements not only include those elements, but also include other elements that are not listed definitely, or further include elements inherent to such process, method, article or device. Without more restrictions, an element defined with wordings "including a . . . " does not exclude presence of other same elements in the process, method, article or device including said element.

In the description of the present disclosure, it should be indicated that orientation or positional relationships indicated by terms such as "upper", "lower", "inner", and "outer" are based on orientation or positional relationships as shown in the drawings, or orientation or positional relationships of a product of the present disclosure when being conventionally placed in use, merely for facilitating describing the present disclosure and simplifying the description, rather than indicating or suggesting that related devices or elements have to be in the specific orientation or configured and operated in a specific orientation, therefore, they should not be construed as limiting the present disclosure.

In the description of the present disclosure, it should be further illustrated that, unless otherwise specifically regulated and defined, the terms "set" and "connect" should be understood in a broad sense, for example, connection may be fixed connection, detachable connection, or integrated connection; it may be mechanical connection or electrical connection; it may be direct joining or indirect joining through an intermediary, and it also may be inner communication between two elements. For those ordinarily skilled in the art, specific meanings of the above-mentioned terms in the present disclosure could be understood according to specific circumstances.

Some embodiments of the present disclosure are described in detail below in combination with the accompanying drawings. The following embodiments and features in the embodiments may be combined with each other without conflict.

As described in the Background Art, currently, the process of fabricating a normally-closed device is generally realized by fabricating a P-type nitride semiconductor gate electrode on a barrier layer. Due to the poor insulation performance of the barrier layer, the occurrence of a large gate current is easily caused. Meanwhile, due to the separation of the barrier layer, the gate electrode is also relatively far from a channel, which is not favorable for obtaining a high threshold voltage.

In view of this, the present disclosure provides a normally-closed device, which makes the process able to be easily implemented by modifying a P-type nitride layer in some regions into a modified layer, and meanwhile increases a threshold voltage of the normally-closed device and decreases gate and drain currents of the normally-closed device.

Hereinafter, the normally-closed device provided in the present disclosure is exemplarily described.

Referring to FIG. 1, as an optional implementation, a normally-closed device 100 includes a substrate 110, an epitaxial layer, a barrier layer 160, and an electrode. In the above, the epitaxial layer includes a first P-type nitride layer 130 and a modified layer 140, and the modified layer 140 is located on two sides of the first P-type nitride layer 130. In the above, the modified layer 140 provided in the present disclosure is formed by modifying a second P-type nitride layer in a preset region, and the first P-type nitride layer 130 and the second P-type nitride layer are formed by epitaxially growing synchronously.

In the above, the present disclosure does not define the material of the substrate 110, for example, the substrate 110 may be a sapphire substrate 110, a silicon substrate 110, or the like.

The epitaxial layer in the present disclosure includes a buffer layer 120, a first P-type nitride layer 130, and a modified layer 140. In a fabrication process, first, the buffer layer 120 is grown along a growth surface of the substrate 110, and then the P-type nitride layer is grown on a surface of the buffer layer 120.

In the above, the buffer layer 120 in the present disclosure may be a GaN buffer layer 120, the P-type nitride layer may be a P-type GaN layer, and certainly, in some other embodiments, other materials also may be possible, for example, a P-type AlGaN layer. Moreover, for convenience of description, the P-type nitride layer provided in the present disclosure may be divided into a first P-type nitride layer 130 and a second P-type nitride layer, wherein the first P-type nitride layer 130 is located in a gate electrode region, the second P-type nitride layer is located in a source electrode region, a region between a gate electrode and a source electrode, a drain electrode region, and a region between the gate electrode and a drain electrode, furthermore, the second P-type nitride layer is located on two sides of the first P-type nitride layer 130.

It may be understood that the first P-type nitride layer 130 and the second P-type nitride layer are actually grown simultaneously, therefore, they have the same doping concentration. Moreover, as an implementation, the first P-type nitride layer 130 and the second P-type nitride layer also have the same height.

Meanwhile, the modification in the present disclosure refers to changing the activity of the second P-type nitride layer, that is, changing the active P-type GaN to be of an N-type or to be in a high resistance state or an insulating type. As an implementation, the property of the second P-type nitride layer may be changed in a manner of ion implantation, for example, N-type impurities such as Si and Ge may be implanted, or the P-type GaN may also be changed to be in a high resistance or insulating state by ion implantation, and optional implanted impurities include N, Ar, and the like.

It may be understood that, when the barrier layer 160 is continuously grown on the basis of the above structure, the P-type layer in contact with the barrier layer 160 is only the first P-type nitride layer 130. Then, the gate electrode is fabricated on the barrier layer 160, and meanwhile the barrier layer 160 on the two sides is etched until the modified layer 140 on two sides is exposed, and then the source electrode and the drain electrode are respectively fabricated. In the above, a material of the barrier layer 160 provided in the present disclosure may be AlGaN, AlInN or AlInGaN.

It should be noted that, the P-type nitride layer will not deplete two-dimensional electron gas in the modified region, thus maintaining a good transport property. Meanwhile, in the art, as the first P-type nitride layer 130 is formed in a manner of ion implantation, a crystal structure is easily damaged. But in the present disclosure, the first P-type nitride layer 130 is realized by a material growth method, which does not easily cause damage to the crystal structure. Moreover, it is easier to modify the P-type nitride layer in some regions to an N-type or an insulating type by a method of performing doping by ion implantation of N-type impurities, so that it is possible to realize that an effective P-type and a desired device structure only exist in some regions.

Meanwhile, by means of the above arrangement, on the one hand, the two-dimensional electron gas will not be depleted partially or completely, therefore on-resistance of the device will not be increased, and on the other hand, the first P-type nitride layer 130 can also be far away from the drain electrode, so that a breakdown voltage of the device is higher.

As an optional implementation, in order to reduce scattering effect and other effects of the first P-type nitride layer 130 or implanted impurities, and improve mobility of channel electrons, the normally-closed device 100 provided in the present disclosure further includes a channel layer 150, wherein one side of the channel layer 150 is connected to the first P-type nitride and the modified layer 140 respectively, and the other side of the channel layer 150 is connected to the barrier layer 160, the source electrode, and the drain electrode. As the gate electrode provided in the present disclosure will not be relatively far from the channel due to the spacing/separation of the barrier layer, it is more advantageous to obtain a higher threshold voltage.

Moreover, in order to make the device more stable, a passivation layer 170 generally also needs to be formed on the barrier layer 160. In order to decrease the gate and drain currents, an insulating layer located between the gate electrode and the barrier layer 160 further may be formed.

Figure 2:
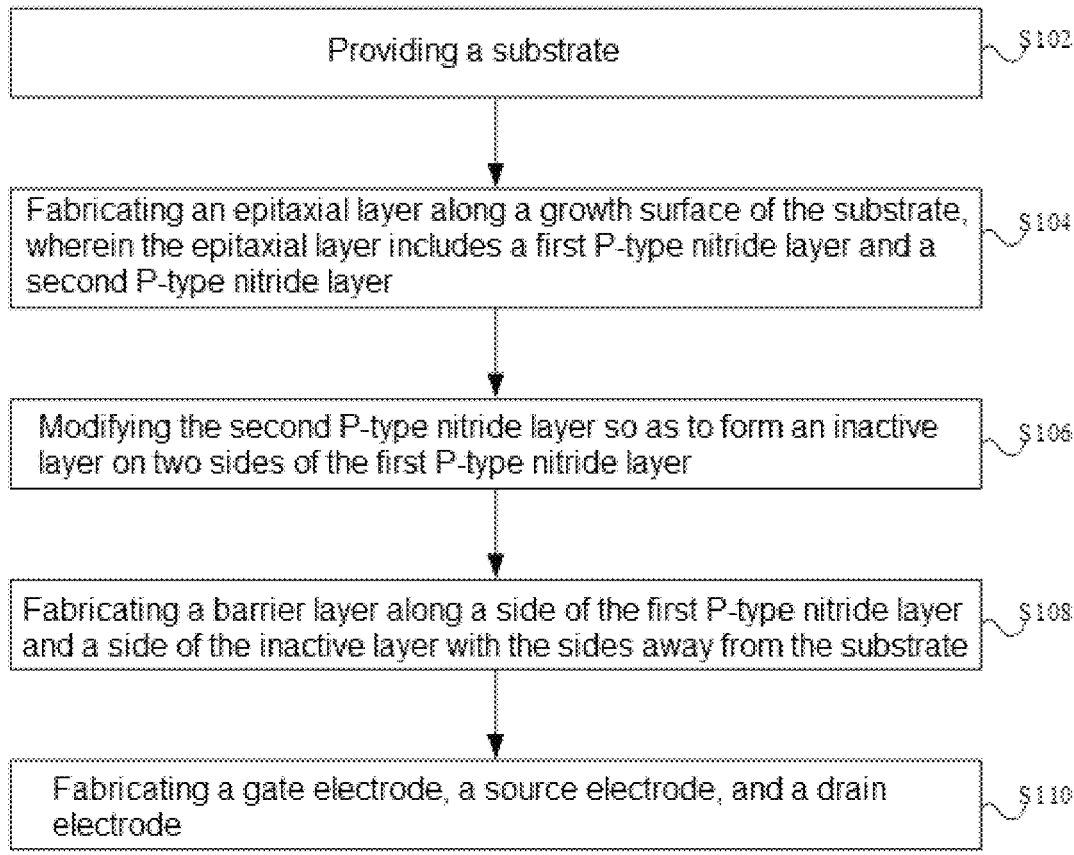
FIG. 2 is a flow chart of a fabrication method of a normally-closed device provided in an embodiment of the present disclosure.

The present disclosure further provides a fabrication method of a normally-closed device. Referring to FIG. 2, the method includes:

S102, providing a substrate;

S104, fabricating an epitaxial layer along a growth surface of the substrate, wherein the epitaxial layer includes a first P-type nitride layer and a second P-type nitride layer, the second P-type nitride layer is located on two sides of the first P-type nitride layer, and the first P-type nitride layer and the second P-type nitride layer are located on a same plane;

S106, modifying the second P-type nitride layer so as to form a modified layer on two sides of the first P-type nitride layer;

S108, fabricating a barrier layer along a side of the first P-type nitride layer and a side of the modified layer, with the sides away from the substrate; and S110, fabricating a gate electrode, a source electrode, and a drain electrode.

Figure 3:
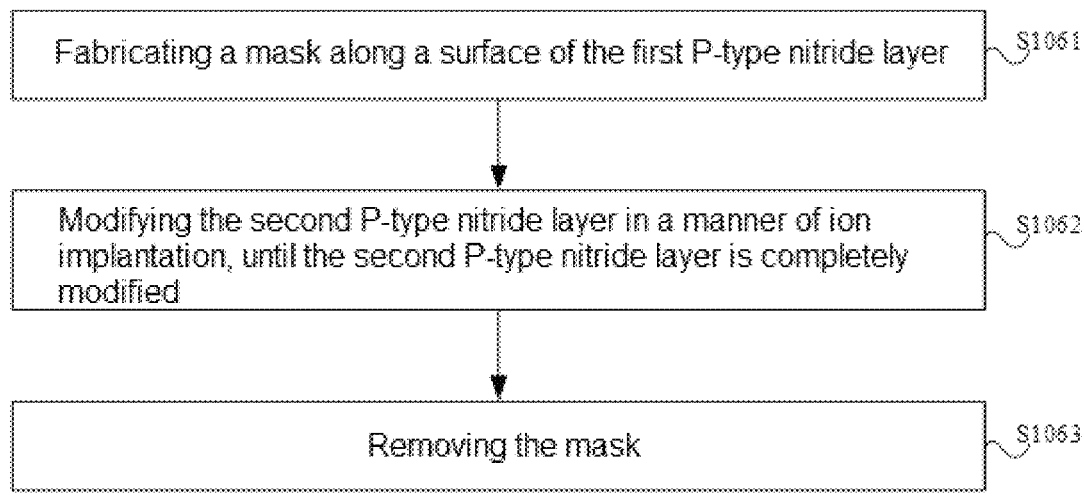
FIG. 3 is a flow chart of sub-steps of S106 in FIG. 2 provided in an embodiment of the present disclosure.

In the above, referring to FIG. 3, S106 includes:

S1061, fabricating a mask along a surface of the first P-type nitride layer;

S1062, modifying the second P-type nitride layer in a manner of ion implantation, until the second P-type nitride layer is completely modified; and S1063, removing the mask.

Certainly, in order to reduce the ion implantation damage, heat treatment or the like also may be performed after removing the mask.

Moreover, S1062 actually may be a step of implanting Si, Ge, N or Ar into the second P-type nitride layer in a manner of ion implantation, wherein when N-type impurities such as Si and Ge are implanted, the second P-type nitride layer may be modified to be of N-type, and when impurities such as N and Ar are implanted, the second P-type nitride layer may be modified to be in a high resistance state or an insulating state.

Optionally, a channel layer also may be epitaxially grown first before the barrier layer is formed, to further reduce scattering effect and other effects caused by the first P-type nitride layer or implanted impurities, and improve the mobility of the electrons in the channel. Meanwhile, in order to make the device more stable, a passivation layer generally further needs to be formed on the barrier layer. In order to decrease the gate current and the drain current, an insulating layer further may be formed between the gate electrode and the barrier layer.

In the above embodiment, as only the first P-type nitride layer 130 exists and the first P-type nitride layer 130 in this region is not connected to an external electrode, the threshold voltage of the device may be caused unstable.

In view of this, in order to make the threshold voltage of the device more stable, an embodiment of the present disclosure further provides another normally-closed device 100. As the normally-closed device 100 provided in the present embodiment is merely partially different from the normally-closed device 100 provided in the preceding embodiment in structure, only differences between the two are described in the present embodiment, while reference is made to the preceding embodiment for similarities.

Figure 4:
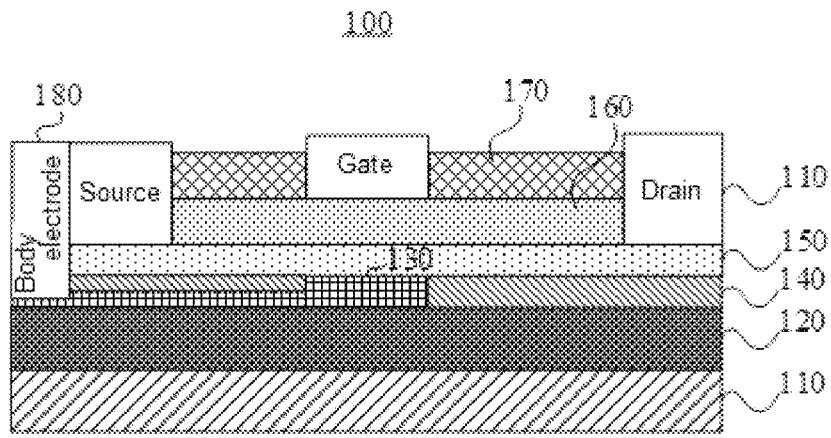
FIG. 4 is a sectional diagram of another normally-closed device provided in an embodiment of the present disclosure.

Referring to FIG. 4, as an implementation, the modified layer 140 located in the drain electrode region and a region between the gate electrode and the drain electrode has the same height as the first P-type nitride layer 130, the height of the modified layer 140 located in the source electrode region and a region between the gate electrode and the source electrode is less than that of the first P-type nitride layer 130, and the modified layer 140 located in the source electrode region and the region between the gate electrode and the source electrode is formed by partially modifying the second P-type nitride layer, so that the modified layer 140 is connected to the second P-type nitride layer and the barrier layer 160, respectively. Moreover, the normally-closed device 100 further includes a body electrode 180, and the body electrode 180 is connected to the second P-type nitride layer and the source electrode, respectively.

It may be understood that the present embodiment retains a part of the second P-type nitride layer in the source electrode region and the region between the gate electrode and the source electrode, and only an upper portion of the second P-type nitride layer is modified, thus, through a lower portion of the second P-type nitride layer, the second P-type nitride layer may be electrically connected to the first P-type nitride layer 130 and the potential of the second P-type nitride layer is controlled. In a practical fabrication process, the mask may be fabricated first in the gate electrode region, and then the second P-type nitride layer on two sides is modified. It should be noted that energy and dose of the ion implantation this time are relatively low, therefore only the property of an upper layer is changed, while the lower second P-type nitride layer is still an active layer.

Then, the mask is removed, and meanwhile a new mask is fabricated, so as to cover the gate electrode region, the region between the gate electrode and the source electrode, and the source electrode region, and ions are implanted at high energy and high dose into the drain electrode region and the region between the gate electrode and the drain electrode, so that the second P-type nitride layer in the drain electrode region and the region between the gate electrode and the drain electrode is completely modified to be of an N-type or an insulating type. Finally, the mask is removed.

Meanwhile, after the electrode has been fabricated, the source electrode region further may be etched, so as to form a mounting region, wherein the mounting region penetrates through the barrier layer 160 and the modified layer 140 located in the source electrode region, and the body electrode 180 is provided in the mounting region.

Certainly, in some other embodiments, the second P-type nitride layer in the drain electrode region and the region between the gate electrode and the drain electrode may also be treated similarly. That is, the second P-type nitride layer in the drain electrode region and the region between the gate electrode and the drain electrode is partially modified, so that the modified layer located in the drain electrode region and the region between the gate electrode and the drain electrode is connected to the second P-type nitride layer and the barrier layer 160, respectively.

Moreover, it should be noted that in order to make the modification effect and the contact effect with the body electrode better, the doping concentration of the second P-type nitride layer provided in the present disclosure is variable in the epitaxial growth direction. For example, as an optional implementation, the doping concentration of the second P-type nitride layer is decreased in the epitaxial growth direction, that is, in the second P-type nitride layer, the doping concentration of a side close to the buffer layer is relatively high, and the doping concentration of a side away from the buffer layer is relatively low, then on this basis, the mounting region may be directly extended to the high concentration region, so that good ohmic contact is formed between the body electrode and the second P-type nitride layer. In another implementation of the present disclosure, the doping concentration of the second P-type nitride layer is decreased first and then increased in the epitaxial growth direction. That is, the second P-type nitride layer has a relatively high doping concentration on the side thereof close to the buffer layer, a relatively low doping concentration in an intermediate region thereof, and also a relatively high doping concentration on the side thereof away from the buffer layer. In this arrangement manner, the mounting region may be extended to the high concentration region close to the buffer layer when the mounting region is fabricated, so as to form a good ohmic contact between the body electrode and the second P-type nitride layer. Meanwhile, as a high concentration doping mode is adopted when modifying the upper portion of the second P-type nitride layer, the unmodified P-type nitride region below the gate electrode has a relatively high doping concentration, so that a relatively high threshold voltage may be obtained.

Figure 5:
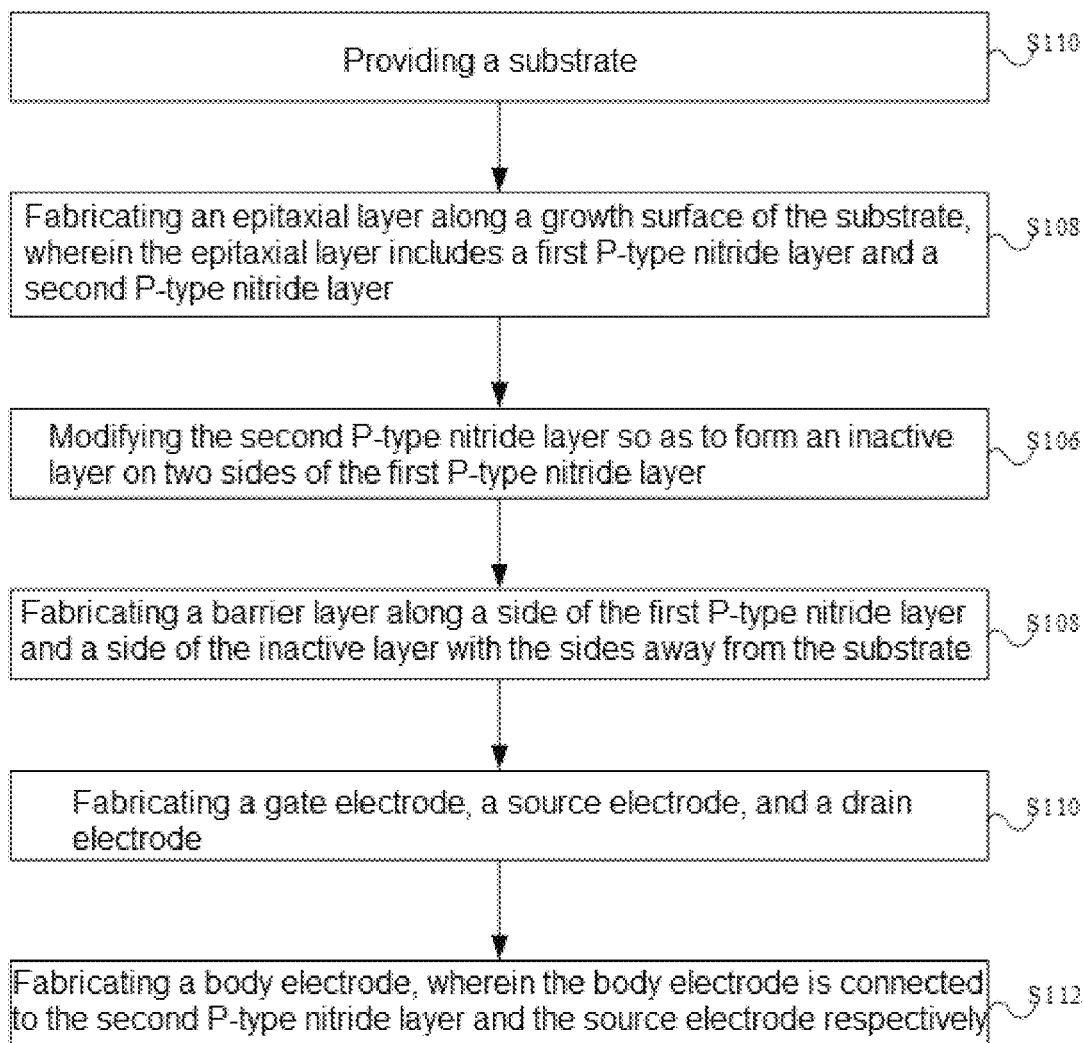
FIG. 5 is a flow chart of a fabrication method of another normally-closed device provided in an embodiment of the present disclosure.

An embodiment of the present disclosure further provides a fabrication method of another normally-closed device, and referring to FIG. 5, the method includes:

S202, providing a substrate;

S204, fabricating an epitaxial layer in a growth surface of the substrate, wherein the epitaxial layer includes a first P-type nitride layer and a second P-type nitride layer, the second P-type nitride layer is located on two sides of the first P-type nitride layer, and the first P-type nitride layer and the second P-type nitride layer are formed by epitaxially growing synchronously;

S206, modifying the second P-type nitride layer so as to form a modified layer on two sides of the first P-type nitride layer;

S208, fabricating a barrier layer along a side of the first P-type nitride layer and a side of the modified layer, with the sides away from the substrate;

S210, fabricating a gate electrode, a source electrode, and a drain electrode; and S212, fabricating a body electrode, wherein the body electrode is connected to the second P-type nitride layer and the source electrode, respectively.

Figure 6:
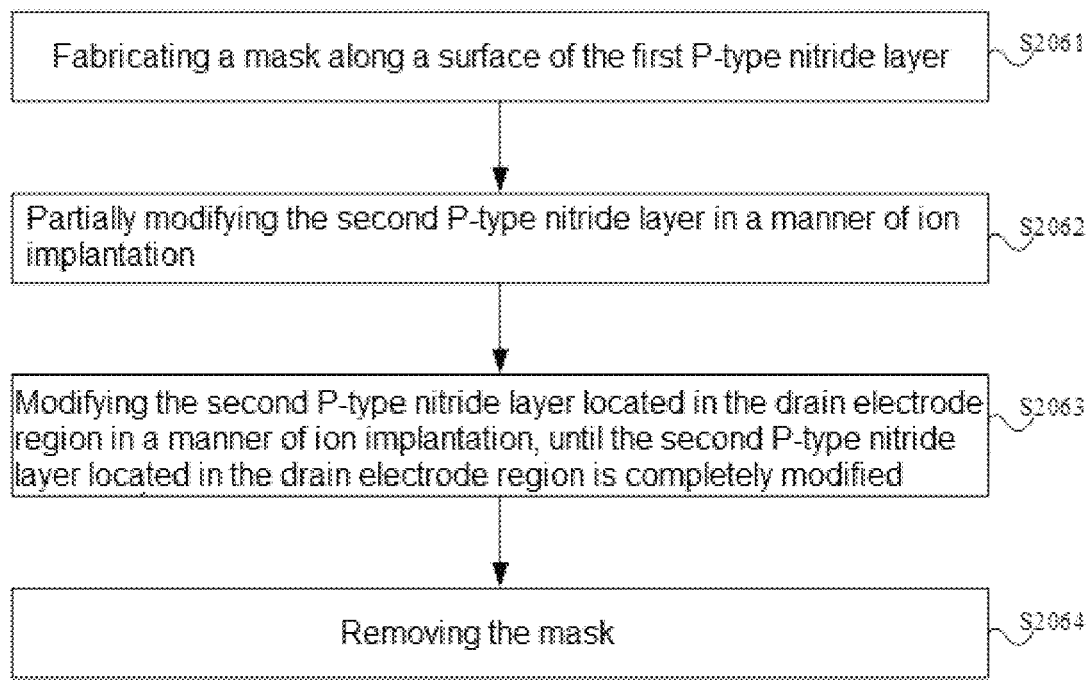
FIG. 6 is a flow chart of sub-steps of S206 in FIG. 5 provided in an embodiment of the present disclosure.

In the above, referring to FIG. 6, S206 includes:

S2061, fabricating a mask along a surface of the first P-type nitride layer;

S2062, partially modifying the second P-type nitride layer in a manner of ion implantation;

S2063, modifying the second P-type nitride layer located in the drain electrode region in a manner of ion implantation, until the second P-type nitride layer located in the drain electrode region is completely modified; and S2064, removing the mask.

In the above, in S2062, ions may be implanted into the second P-type nitride layer according to first energy and dose.

In S2063, ions may be implanted into the second P-type nitride layer according to second energy and dose, wherein the first energy and dose are less than the second energy and dose.

To sum up, the embodiments of the present disclosure provide a normally-closed device and a fabrication method thereof, wherein the normally-closed device includes a substrate; an epitaxial layer connected to the substrate, wherein the epitaxial layer includes a first P-type nitride layer and a modified layer, the modified layer is located on two sides of the first P-type nitride layer, the modified layer is formed by modifying a second P-type nitride layer in a preset region, and the first P-type nitride layer and the second P-type nitride layer are formed by epitaxially growing synchronously; a barrier layer connected to the first P-type nitride layer and the modified layer; a gate electrode connected to the barrier layer, and a source electrode and a drain electrode connected to the modified layer. Since the manner of performing modification in some regions is easier to realize, it can be more convenient to realize that an effective P-type and desired device structure only exist in some regions.

The above-mentioned are merely preferred embodiments of the present disclosure and not used to limit the present disclosure. For one skilled in the art, various modifications and changes may be made to the present disclosure. Any modifications, equivalent substitutions, improvements and so on, within the spirit and principle of the present disclosure, should be covered within the scope of protection of the present disclosure.

For one skilled in the art, obviously, the present disclosure is not limited to details of the above exemplary embodiments, and without departing from the spirit or basic features of the present disclosure, the present disclosure could be implemented in other specific forms. Therefore, no matter from which point of view, the embodiments should be regarded as exemplary but non-limiting, the scope of the present disclosure is defined by the appended claims rather than the above description, therefore all changes falling within the meaning and scope of equivalents of the claims are intended to be covered within the present disclosure. Any reference signs in the claims should not be regarded as limiting the claims involved.

INDUSTRIAL APPLICABILITY

The present disclosure provide a normally-closed device and a fabrication method thereof, which solve the problems existing in the prior art that the normally-closed device has relatively low threshold voltage and relative high gate and drain currents, and as it is easier to realize the manner of performing modification in some regions, it can be more conveniently realized that an effective P-type and desired device structure only exist in some regions.

What is claimed is:

1. A normally-closed device, wherein the normally-closed device comprises:
   a substrate;
   an epitaxial layer connected to the substrate, wherein the epitaxial layer comprises a first P-type nitride layer and a modified layer, the modified layer is located on two sides of the first P-type nitride layer, the modified layer is formed by modifying a second P-type nitride layer in a preset region, and the first P-type nitride layer and the second P-type nitride layer are formed by epitaxially growing synchronously;
   a barrier layer connected to the first P-type nitride layer and the modified layer; and
   a gate electrode connected to the barrier layer, and a source electrode and a drain electrode connected to the modified layer,
   wherein a height of the modified layer located in a source electrode region and a region between the source electrode and the drain electrode is less than a height of the first P-type nitride layer, and the modified layer located in the source electrode region and a region between the source electrode and the drain electrode is formed by partially modifying the second P-type nitride layer, so that the modified layer is connected to the second P-type nitride layer and the barrier layer, respectively, and wherein the normally-closed device further comprises a body electrode connected to the second P-type nitride layer and the source electrode, respectively, wherein a doping concentration of the second P-type nitride layer is variable in an epitaxial growth direction, and wherein the doping concentration of the second P-type nitride layer is decreased first and then increased in the epitaxial growth direction.

2. The normally-closed device according to claim 1, wherein the epitaxial layer comprises a buffer layer, and the buffer layer is grown along a growth surface of the substrate.

3. The normally-closed device according to claim 2, wherein the normally-closed device comprises a mounting region, the mounting region penetrates through the barrier layer and the modified layer located in the source electrode region, and the body electrode is provided in the mounting region.

4. The normally-closed device according to claim 3, wherein the normally-closed device further comprises a passivation layer formed on the barrier layer.

5. The normally-closed device according to claim 4, wherein the normally-closed device further comprises an insulating layer located between the gate electrode and the barrier layer.

6. The normally-closed device according to claim 5, wherein the normally-closed device further comprises a channel layer, wherein one side of the channel layer is connected to the first P-type nitride layer and the modified layer respectively, and the other side of the channel layer is connected to the barrier layer, the source electrode, and the drain electrode.

7. The normally-closed device according to claim 1, wherein the epitaxial layer comprises a buffer layer, and the buffer layer is grown along a growth surface of the substrate.

8. The normally-closed device according to claim 1, wherein the normally-closed device comprises a mounting region, the mounting region penetrates through the barrier layer and the modified layer located in the source electrode region, and the body electrode is provided in the mounting region.

9. The normally-closed device according to claim 1, wherein the normally-closed device further comprises a passivation layer formed on the barrier layer.

10. The normally-closed device according to claim 1, wherein the normally-closed device further comprises an insulating layer located between the gate electrode and the barrier layer.

11. The normally-closed device according to claim 1, wherein the normally-closed device further comprises a channel layer, wherein one side of the channel layer is connected to the first P-type nitride layer and the modified layer respectively, and the other side of the channel layer is connected to the barrier layer, the source electrode, and the drain electrode.

* * * * *